(12) United States Patent
Yang

(10) Patent No.: US 10,739,406 B2
(45) Date of Patent: Aug. 11, 2020

(54) CORRELATION CHARGING METHOD, CHARGING APPARATUS, AND SYSTEM

(71) Applicant: HUAWEI TECHNOLOGIES CO., LTD., Shenzhen (CN)

(72) Inventor: Enfeng Yang, Nanjing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/599,762

(22) Filed: Oct. 11, 2019

(65) Prior Publication Data

US 2020/0041572 A1 Feb. 6, 2020

Related U.S. Application Data

(63) Continuation of application No. PCT/CN2018/085747, filed on May 5, 2018.

(30) Foreign Application Priority Data

Jun. 8, 2017 (CN) .......................... 2017 1 0428340

(51) Int. Cl.
*G01R 31/36* (2020.01)
*G01R 31/392* (2019.01)
(Continued)

(52) U.S. Cl.
CPC ....... *G01R 31/3648* (2013.01); *G01R 31/392* (2019.01); *H04L 12/14* (2013.01);
(Continued)

(58) Field of Classification Search
CPC . H04L 12/14; H04L 12/1403; H04L 65/1016; H04M 15/57; H04M 2215/208;
(Continued)

(56) References Cited

U.S. PATENT DOCUMENTS

2007/0173226 A1 7/2007 Cai et al.
2008/0195535 A1 8/2008 Liu
(Continued)

FOREIGN PATENT DOCUMENTS

CN 101132289 A 2/2008
CN 101167097 A 4/2008

OTHER PUBLICATIONS

3GPP TS 32.260 V14.1.0 (Jul. 2017),3rd Generation Partnership Project;Technical Specification Group Services and System Aspects;Telecommunication management;Charging management;IP Multimedia Subsystem (IMS) charging (Release 14),total 194 pages.

*Primary Examiner* — Nam T Huynh
(74) *Attorney, Agent, or Firm* — Stein IP, LLC

(57) ABSTRACT

A correlation charging method and a charging apparatus, wherein the charging apparatus may determine, based on identifiers of a plurality of application servers in a notification message sent by a CSCF device, whether the charging apparatus receives charging request messages from all the ASs; then send a detection message to a first AS from which the charging apparatus has not received any charging request message, to detect a charging capability of the first AS; and learn of the charging capability of the first AS based on a response message returned by the first AS. In this way, the charging apparatus can learn of charging capabilities of all the ASs, and charge the service based on the charging capabilities of all the ASs in a unified manner.

16 Claims, 3 Drawing Sheets

(51) Int. Cl.
*H04L 12/14* (2006.01)
*H04W 4/24* (2018.01)
*H04M 15/00* (2006.01)

(52) U.S. Cl.
CPC ...... *H04L 12/1403* (2013.01); *H04L 12/1407* (2013.01); *H04M 15/57* (2013.01); *H04M 15/66* (2013.01); *H04W 4/24* (2013.01); *H04M 15/56* (2013.01); *H04M 15/64* (2013.01); *H04M 15/65* (2013.01)

(58) Field of Classification Search
CPC ...... H04M 15/00; H04M 15/55; H04M 15/64; H04M 15/65; H04M 15/66; H04M 15/67; H04W 4/24
See application file for complete search history.

(56) References Cited

U.S. PATENT DOCUMENTS

2010/0268826 A1\* 10/2010 Dahl
2016/0127565 A1 5/2016 Sharma et al.

\* cited by examiner

CORRELATION CHARGING METHOD, CHARGING APPARATUS, AND SYSTEM

CROSS-REFERENCE TO RELATED APPLICATIONS

This application is a continuation of International Application No. PCT/CN2018/085747, filed on May 5, 2018, which claims priority to Chinese Patent Application No. 201710428340.8, filed on Jun. 8, 2017, the disclosures of the aforementioned applications are hereby incorporated by reference in their entireties.

TECHNICAL FIELD

Aspects of the present disclosure relate to the field of communications technologies, and more specifically, to a correlation charging method, a charging apparatus, and a system.

BACKGROUND

In an IP multimedia subsystem (IP Multimedia Subsystem, IMS) network, a multimedia service of a user such as a voice over LTE (Voice Over Long Term Evolution, VoLTE) service may be controlled by a plurality of different application servers (Application Server, AS), such as a service centralization and continuity application server (Service Centralization and Continuity Application Server, SCC AS) and an anchor AS. A charging apparatus in the IMS network may correlate charging messages reported by a plurality of ASs, to obtain a charging session corresponding to a same service; and then performs charging.

In the prior art, ASs may be provided by different manufacturers, and ASs of different manufacturers support different charging capabilities. For example, some ASs have an online charging capability, and some ASs have an offline charging capability. Therefore, the charging apparatus cannot learn of charging capabilities of a plurality of ASs triggered by a same service, and consequently cannot perform unified charging based on charging messages of all the ASs, causing a user charging error.

SUMMARY

Embodiments of the present disclosure provide a correlation charging method, a charging apparatus, and a system, to implement correlation charging based on ASs with different charging capabilities.

According to a first aspect, an embodiment of the present disclosure provides a correlation charging method. The method is mainly implemented by a charging apparatus, and the method includes:

receiving a notification message sent by a call session control function device, where the notification message carries identifiers of a plurality of application servers ASs triggered by a service; determining whether the charging apparatus receives charging request messages from all the ASs within a preset period, where the charging request messages carry the identifiers of the ASs, and the charging request messages are used to request the charging apparatus to charge the service; and if the charging apparatus receives the charging request messages from all the ASs within the preset period, charging the service based on all the received charging request messages; or if the charging apparatus does not receive the charging request messages from all the ASs within the preset period, sending a detection message to a first AS from which the charging apparatus has not received any charging request message, where the detection message is used to obtain a charging capability of the first AS; and receiving, by the charging apparatus, a response message returned by the first AS, and performing correlation charging on the service based on the received charging request messages and the charging capability that is carried in the response message. Therefore, the charging apparatus can obtain, in a unified manner, charging requests and capabilities of all the ASs associated with the current service, and charge the service in a unified manner.

With reference to the first aspect, in a possible implementation, the performing, by the charging apparatus, of correlation charging on the service based on the received charging request messages and the charging capability that is carried in the response message includes:

when the charging capability carried in the response message is offline charging, performing offline correlation charging on the service based on the received charging request messages. To be specific, this avoids confusion that is caused because offline charging and online charging are simultaneously performed, thereby improving charging efficiency.

With reference to the first aspect, in a possible implementation, the performing, by the charging apparatus, of correlation charging on the service based on all the received charging request messages includes:

if the charging request messages sent by all the ASs include at least one offline charging request messages, performing offline correlation charging on the service based on charging request messages sent by all the ASs.

With reference to the first aspect, in a possible implementation, the method further includes: if all the charging request messages sent by all the ASs are online charging requests, performing, by the charging apparatus, online correlation charging on the service based on the charging request messages sent by all the ASs. This improves user experience by using a real-time feature of online charging.

According to a second aspect, an embodiment of the present disclosure further provides a charging apparatus for correlation charging. The apparatus includes a receiving module, a determining module, a sending module, and a charging module.

The receiving module is mainly configured to receive a notification message sent by a call session control function device, where the notification message carries identifiers of a plurality of application servers ASs triggered by a service.

The determining module is mainly configured to determine whether the charging apparatus receives charging request messages from all the ASs within a preset period, where the charging request messages carry the identifiers of the ASs.

The sending module is mainly configured to send a detection message to a first AS from which the charging apparatus has not received any charging request message, where the detection message is used to obtain a charging capability of the first AS.

The receiving module is further configured to receive a response message returned by the first AS; and the charging module in the charging apparatus is mainly configured to perform correlation charging on the service based on the received charging request messages and the charging capability that is carried in the response message.

With reference to the second aspect, in a possible implementation, the charging module in the charging apparatus is further configured to: when the charging apparatus receives the charging request messages from all the ASs within the preset period, charge the service based on all the received charging request messages, where the charging request messages carry the identifiers of the ASs.

With reference to the second aspect, in a possible implementation, the charging module is specifically configured to: when the charging capability carried in the response message is offline charging, perform offline correlation charging on the service based on the received charging request messages. To be specific, this avoids confusion that is caused because offline charging and online charging are simultaneously performed, thereby improving charging efficiency.

With reference to the second aspect, in a possible implementation, the charging module is specifically configured to: when the charging request messages sent by all the ASs include at least one offline charging request messages, perform offline correlation charging on the service based on the charging request messages sent by all the ASs.

According to a third aspect, an embodiment of the present disclosure provides a charging apparatus. The charging apparatus may be implemented by using a general-purpose computer. The charging apparatus includes a memory, a processor and a bus. The memory and the processor are connected by using the bus. In addition, the charging apparatus further includes an input device and an output device that are connected to the bus. The memory stores executable program code. When the processor executes the executable code, the charging apparatus performs the correlation charging method in the first aspect.

According to a fourth aspect, an embodiment of the present disclosure further provides a computer program product including program code. When the computer program product runs on a computer, the computer performs the method in the first aspect.

According to a fifth aspect, an embodiment of the present disclosure further provides a correlation charging system, including the charging apparatus, the application server AS, and the call session control function CSCF device that are provided in the foregoing aspects.

In an embodiment according to any one of the foregoing aspects, the notification message and the charging request message each can carry an identifier of a charging session. In addition, the detection message and the response message each can also carry the identifier of the charging session, so that the charging apparatus correlates, in a unified manner, network elements of a current charging session and related charging messages.

DESCRIPTION OF EMBODIMENTS

Figure 1:
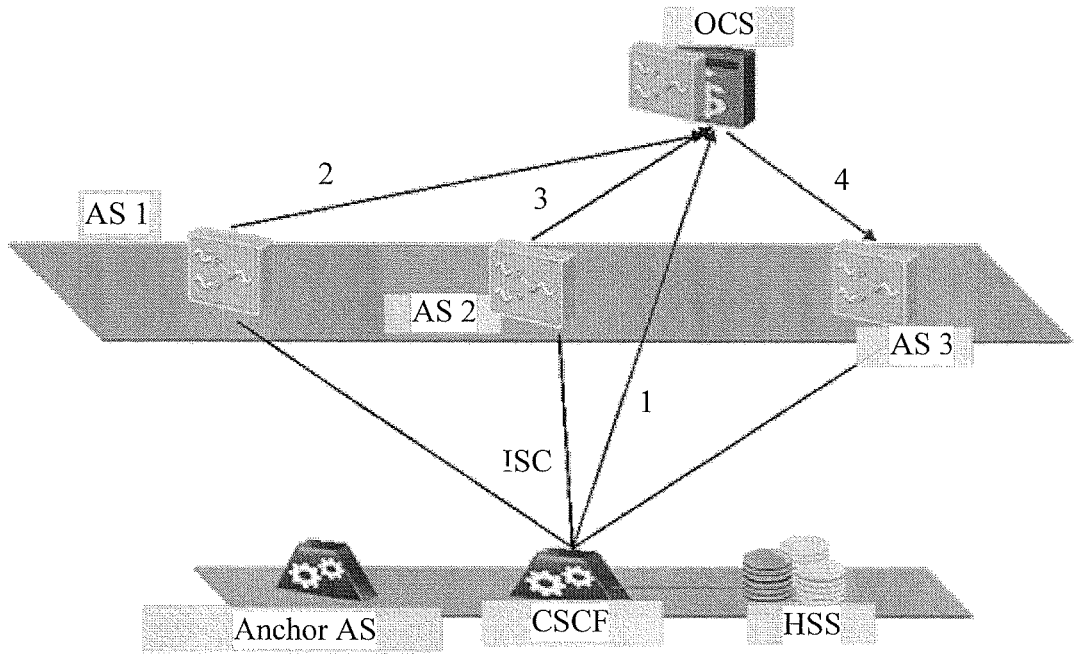
FIG. 1 is a diagram of a system architecture of a technical solution according to an embodiment of the present disclosure.

FIG. 1 is a diagram of a system architecture for implementing a technical solution according to an embodiment of the present disclosure. The following describes a network element connection relationship and a network element function in the system architecture.

A call session control function (call session control function, CSCF) device is configured to implement functions such as user registration, authentication, session control, and security management. The CSCF device may receive a service request initiated by user equipment (UE), and trigger the service request of user equipment such as a VoLTE call service request to a plurality of ASs (an AS 1, an AS 2, and an AS 3) for control. A VoLTE service belongs to an IMS service, and the CSCF device needs to perform IMS service control (IMS service control, ISC) on the VoLTE service. In a service control process, an AS may send a charging request message (for example, an offline charging request or an online charging request) to a charging apparatus (charging apparatus) by using an Ro interface, and the charging apparatus charges a service of a user based on the received charging request messages. If the user roams, the service is further triggered to an anchor (anchor) AS.

The user equipment UE may include a set top box (set top box, STB), a mobile phone, a tablet computer Pad, a personal computer PC, or the like. The charging apparatus may be an online charging system (online charging system, OCS) or a convergent billing system (convergent billing system, CBS). In FIG. 1, the OCS is used as an example for description. A home subscriber server HSS mainly stores user-related service subscription data and the like.

Figure 2:
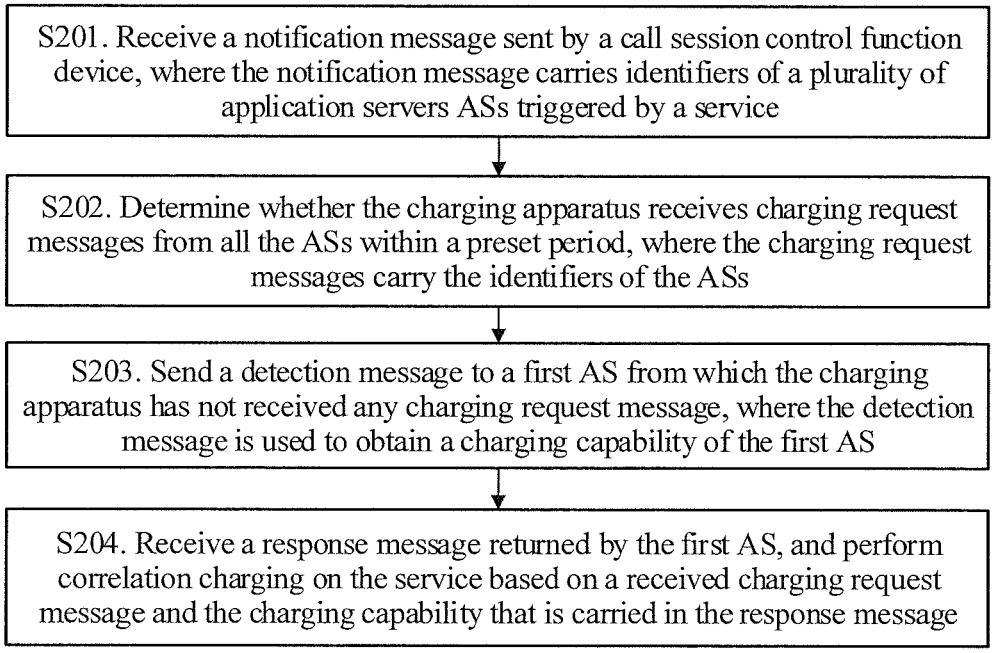
FIG. 2 is a schematic diagram of a correlation charging method according to an embodiment of the present disclosure.

The following describes the embodiments of the present disclosure in detail with reference to accompanying drawings. FIG. 2 is a schematic diagram of a correlation charging method according to an embodiment of the present disclosure. Based on the network architecture and the concept in FIG. 1, the method includes the following steps.

S201. A charging apparatus receives a notification message sent by a CSCF device, where the notification message carries identifiers of ASs triggered by a service.

When a user starts to use a service such as a VoLTE service by using user equipment UE (which may be referred to as service session initiation), the CSCF device triggers the service to a plurality of ASs such as an SCC AS. The CSCF device may send a notification message to the charging apparatus by using an Ro interface, where the notification message carries identifiers of the plurality of ASs triggered by the service. The identifier of the AS includes but is not limited to an IP address of the AS.

In a process of performing the service, the plurality of ASs may send charging requests to the charging apparatus by using an online charging interface or an offline charging interface, wherein the requests carry the identifiers of the ASs.

S202. The charging apparatus determines whether the charging apparatus receives charging request messages from all the ASs within a preset period, where the charging request messages carry the identifiers of the ASs.

The charging apparatus may determine, within the preset period after the charging apparatus receives the notification message sent by the CSCF device, whether the charging apparatus receives charging request messages from all the ASs. The charging request messages carry the identifiers of the ASs and charging capabilities of the ASs. In addition, the charging request messages may further carry specific service usage, such as duration and traffic.

If the charging apparatus receives, within the preset period, the charging request messages from all the ASs, the charging apparatus performs online correlation charging or offline correlation charging on the service based on the charging capabilities carried in the charging request messages. For example, if a charging capability of an AS in the plurality of charging request messages received within the preset period is offline charging, the charging apparatus may perform offline correlation charging on the service in a unified manner. If all the charging capabilities in the charging request messages sent by all the ASs are online charging, the charging apparatus may perform online correlation charging on the service in a unified manner.

If the charging apparatus does not receive the charging request messages from all the ASs within the preset period, the following step is further performed.

S203. The charging apparatus sends a detection message to a first AS from which the charging apparatus has not received any charging request message, where the detection message is used to obtain a charging capability of the first AS.

The charging apparatus may determine ASs from which the charging apparatus has not received any charging request message within the preset period, and then send detection messages to these ASs (one or more ASs). The detection messages are used to obtain actual charging capabilities (or charging statuses) of these ASs. The first AS is one of the ASs from which the charging apparatus has not received any charging request message.

The detection message may be sent by using an existing Ro interface between the charging apparatus and the AS, or may be sent by using a newly added interface.

S204. The charging apparatus receives a response message returned by the first AS, and charges the service based on the received charging request messages and the charging capability that is carried in the response message.

The charging apparatus may perform offline correlation charging or online correlation charging on the service based on the received charging request messages and the charging capability that is carried in the response message.

In this embodiment of the present disclosure, the charging apparatus may determine, based on the identifiers of the plurality of application servers in the notification message sent by the CSCF device, whether the charging apparatus receives charging request messages from all the ASs; then send detection messages to other ASs from which the charging apparatus has not received any charging request message, to detect charging capabilities of the other ASs; and learn of the charging capabilities of these ASs based on response messages returned by these ASs. In this way, the charging apparatus can learn of the charging capabilities of all the ASs, and charge the service based on the charging capabilities of all the Ass in a unified manner. This avoids a technical disadvantage that a user charging error is caused because in a charging method in the prior art, unified charging cannot be performed based on charging messages reported by ASs with different charging capabilities.

In an embodiment, if a charging capability carried in a response message returned by one of the ASs is offline charging, the charging apparatus performs offline correlation charging on the service based on the received charging request messages. Specifically, the charging apparatus may write online charging requests in all the charging request messages as offline charging files, and then correlate the plurality of offline charging files for offline correlation charging. If the charging capability carried in the response message is online charging, the charging apparatus performs online correlation charging on the service.

In another optional embodiment, if the charging request messages sent by all the ASs include at least one offline charging request messages, offline correlation charging is performed on the service based on charging request messages sent by all the ASs. In addition, if charging request messages received within the preset period include at least one offline charging request messages, the charging apparatus may not send the detection message to the AS from which the charging apparatus has not received any charging request message; instead, the charging apparatus may perform offline correlation charging on the service based on the charging request messages received from the AS within the preset period. For example, the charging apparatus writes online charging requests in the charging request messages as offline charging files, and then correlates the plurality of offline charging files for offline correlation charging.

In a process of performing the foregoing online correlation charging, if the charging apparatus determines that a charging session of one of the ASs is interrupted, the charging apparatus converts all other online correlation charging associated with the charging session into offline correlation charging. In other words, all the ASs perform offline correlation charging with a charging system by using an offline charging interface (for example, an Rf interface), thereby improving charging consistency and accuracy.

The following further describes the embodiments of the present disclosure in detail based on a common aspect of the present disclosure described above.

Figure 3:
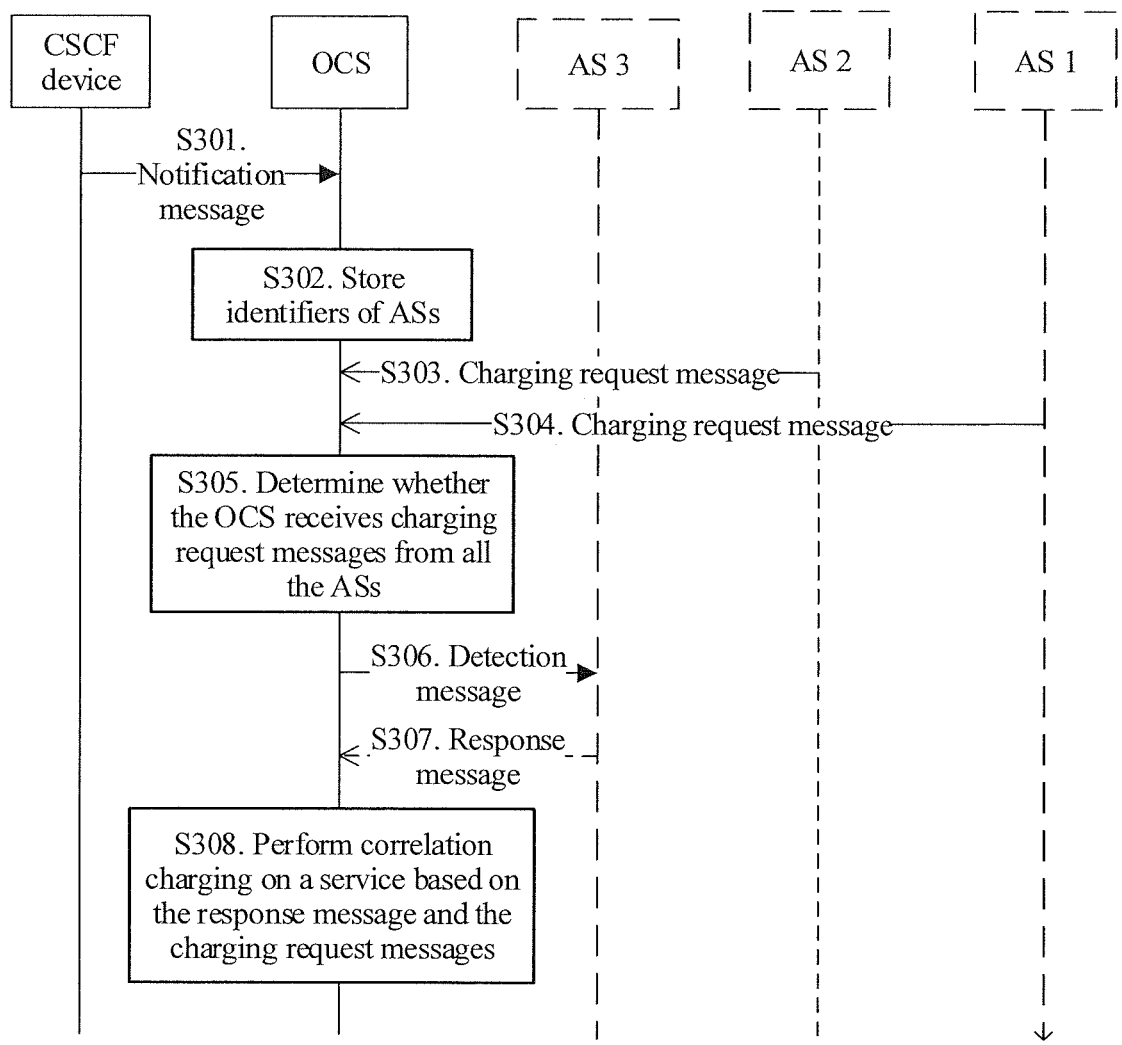
FIG. 3 is a schematic diagram of another correlation charging method according to an embodiment of the present disclosure.

FIG. 3 is a schematic diagram of another correlation charging method according to an embodiment of the present disclosure.

A user initiates a service such as a VoLTE video call service by using a user terminal; and when the user roams, the service is triggered by a CSCF device to a plurality of ASs (for example, an AS 1, an AS 2, and an AS 3). The CSCF device obtains identifiers of all the ASs triggered by the service, such as IP addresses or Session Initiation Protocol addresses. A charging apparatus is specifically an OCS in this embodiment.

S301. A CSCF device sends a notification message to an OCS, where the notification message carries identifiers of a plurality of application servers ASs triggered by the service.

The notification message may be sent by using an Ro interface. The notification message may further carry a quantity of ASs and an identifier of a charging session.

For example, an identifier of an IMS charging session may be represented by using the following attribute value pair (Attribute Value Pair, AVP):

IMS-charging-identifier (IMS-Charging-Identifier, ICID) AVP

The AVP is used to uniquely identify one charging session. The CSCF device synchronously sends a value of the AVP to all the ASs. A charging request message sent by each AS to the OCS also carries the AVP. The OCS correlates the CSCF device with the ASs based on the AVP, where the CSCF device and ASs are corresponding to one charging session.

In addition, the notification message may further carry an IMS-information (IMS-Information) AVP. The AVP is used to carry an IMS-information network parameter of a current VoLTE service, such as a UE location or time, where the network parameter is used as a reference for charging.

An IMS-communication-service-identifier [IMS-Communication-Service-Identifier] AVP group in this AVP can carry the identifiers of the plurality of ASs for the OCS. Because service-associated trigger is controlled by the CSCF device, the CSCF device can obtain the ASs associated with the service from a local policy. In this embodiment, the plurality of ASs include the AS 1, the AS 2, and the AS 3.

S302. The OCS receives the notification message sent by the CSCF device, and stores the AS identifiers and a session identifier that are carried in the notification message.

S303 and S304. An AS 1 and an AS 2 send charging request messages to the OCS, where the charging request messages carry the identifier ICID of the charging session.

The charging request messages sent by the AS 1 and the AS 2 may be offline charging requests or online charging requests. This is specifically based on actual charging capabilities of the AS 1 and the AS 2. If the AS 1 or the AS 2 sends an offline charging request to the OCS, the OCS performs offline correlation charging based on all the ASs in a unified manner. To be specific, the OCS writes the received offline charging request as a charging file; and after a charging session ends, correlates the charging file with charging files of other ASs for offline correlation charging.

In this embodiment, an example in which the AS 1 and the AS 2 support online charging and the AS 1 and the AS 2 send online charging requests to the OCS is used for description. The online charging request carries real-time charging information, such as service usage.

S305. The OCS determines whether the OCS receives charging request messages from all the ASs within a preset period.

In this embodiment, the AS3 is faulty and therefore does not send a charging request message to the OCS within the preset period, and the OCS determines that the OCS receives no charging request message from the AS3 within the preset period. Therefore, current charging request correlation is incomplete.

The OCS may set a local waiting time policy. A waiting time is usually set to a millisecond level, and 100 milliseconds are recommended.

S306. The OCS sends a detection message to an AS 3, where the detection message carries the identifier of the charging session.

The OCS may send the detection message (or a query message) to the AS 3 by using an existing Ro interface or a newly added Ro' interface, to obtain a charging capability (or a charging status) of the AS 3.

A format of the detection message may be as follows:
<IN-Request>::=<Diameter Header: XXX (allocated by a special organization), REQ, PXY>
<Session-Id>
{Auth-Application-Id}
{Origin-Host}
{Origin-Realm}
[Destination-Realm]
[Destination-Host]
[IP-Domain-Id]
[Auth-Session-State]
[IMS-Communication-Service-Identifier]

In the detection message, the identifier ICID of the charging session is carried by using the [IMS-Communication-Service-Identifier] AVP, to request the charging status from the network element AS 3.

S307. After receiving the detection message, the AS 3 replies to the OCS with a response message.

A format format of the response message with which the AS 3 replies may be as follows:
<IN-Answer>::=<Diameter Header: XXX, PXY>
<Session-Id>
{Auth-Application-Id}
{Origin-Host}
{Origin-Realm}
[Result-Code]
[Experimental-Result]
[Auth-Session-State]
[Online-Charging-Status]

The [Online-Charging-Status] AVP in the message is used by the AS 3 to report the charging capability of the AS 3 to the OCS.

S308. The OCS charges the service based on the received response message and the charging request messages from the AS 1 and the AS 2.

A process of performing charging by the OCS varies with a value of the [Online-Charging-Status] AVP. The following provides detailed descriptions.

The value of the [Online-Charging-Status] AVP may include the following:

1. ON-GOING (0): The session is being initiated. In this case, the AS 3 sends a charging request message to the OCS, but the OCS fails to receive the message because the charging request message is delayed, or discarded halfway due to a network/overload, or the like. It indicates that the AS 3 supports online charging. In this case, after receiving the response message, the OCS continues waiting for the charging request message of the AS 3 to be sent to the OCS. The OCS sets a local policy and a waiting time. A recommended value is 500 milliseconds. After receiving the charging request message sent by the AS 3, the OCS performs online correlation charging on the service based on the charging request messages from the AS 1, the AS 2 and the AS 3 in a unified manner.

If a charging request is still not received after 500 milliseconds, the entire ICID charging session is transferred to an offline Rf interface for offline correlation charging processing. The OCS correlates charging files as which charging requests of the AS 1 and the AS 2 are written, and combines the charging files into one charging file. Then, the OCS performs charging based on the file obtained through correlation and combination.

2. Off-Charging (1): Online charging is not supported.

In this case, after receiving the response message of the AS 3, the OCS transfers charging requests of all the ASs of the current charging session to an offline Rf interface for offline correlation charging processing. The OCS correlates charging files as which charging requests of the AS 1 and the AS 2 are written, and combines the charging files into one charging file. Then, the OCS performs charging based on the file obtained through correlation and combination.

3. No-Need-Charging (2): For this service, the AS 3 can support online charging.

However, in a current service scenario, the AS 3 does not need to apply for charging and has no impact on charging of another AS.

In this case, the OCS ignores a request of the AS 3, and performs online correlation charging or offline correlation charging on the service based on the charging request messages from the AS 1 and the AS 2.

Figure 4:
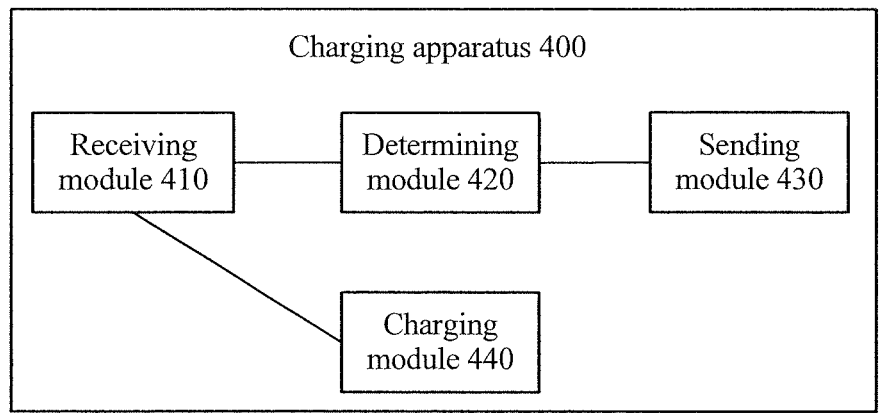
FIG. 4 is a schematic functional diagram of a charging apparatus according to an embodiment of the present disclosure.

FIG. 4 is a possible schematic structural diagram (schematic functional diagram) of the charging apparatus in the foregoing embodiments. A charging apparatus 400 includes a receiving module 410, a determining module 420, a sending module 430, and a charging module 440.

The receiving module 410 is mainly configured to receive a notification message sent by a call session control function device, where the notification message carries identifiers of a plurality of application servers ASs triggered by a service.

The determining module 420 is mainly configured to determine whether the charging apparatus receives charging request messages from all the ASs within a preset period, where the charging request messages carry the identifiers of the ASs.

The sending module 430 is mainly configured to send a detection message to a first AS from which the charging apparatus has not received any charging request message, where the detection message is used to obtain a charging capability of the first AS.

The receiving module 410 is further configured to receive a response message returned by the first AS; and the charging module 440 in the charging apparatus 400 is mainly configured to perform correlation charging on the service based on the received charging request messages and the charging capability that is carried in the response message.

In this embodiment, the charging apparatus 400 may be specifically an online charging system or a convergent billing system.

In this embodiment, the charging module 440 in the charging apparatus 400 is further configured to: when the charging apparatus receives the charging request messages from all the ASs within the preset period, charge the service based on all the received charging request messages, where the charging request messages carry the identifiers of the ASs.

In this embodiment, the charging module 440 is specifically configured to:

when the charging capability carried in the response message is offline charging, perform offline correlation charging on the service based on the received charging request messages. To be specific, this avoids confusion that is caused because offline charging and online charging are simultaneously performed, thereby improving charging efficiency.

In addition, the charging module 440 is specifically configured to:

when the charging request messages sent by all the ASs include at least one offline charging request message, perform offline correlation charging on the service based on charging request messages sent by all the ASs.

For function details of the modules in the foregoing charging apparatus, refer to related descriptions in the foregoing method embodiments in FIG. 2 and FIG. 3.

Figure 5:
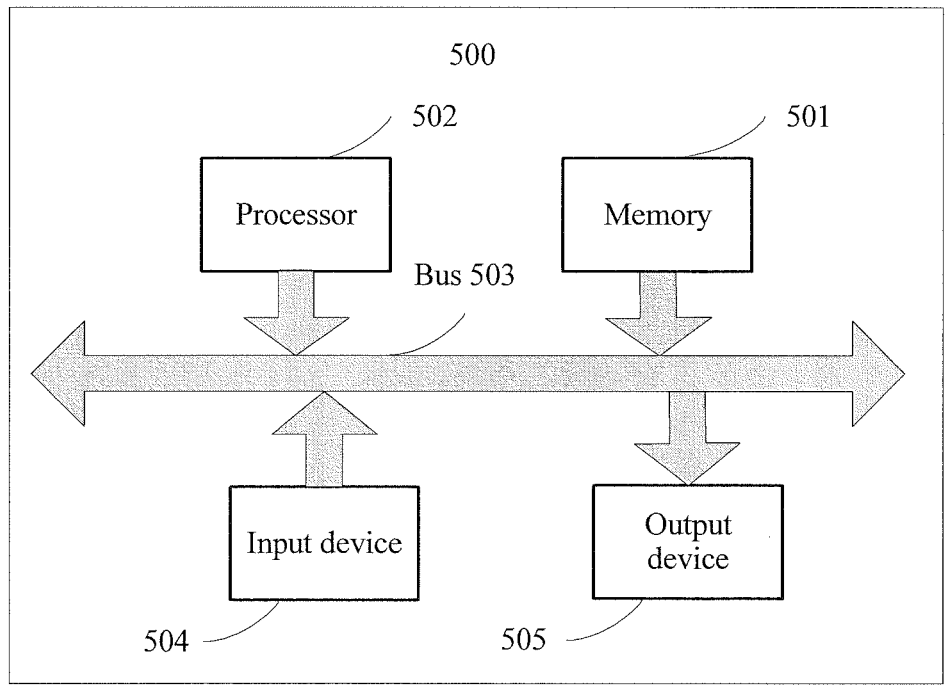
FIG. 5 is a structural hardware diagram of a charging apparatus according to an embodiment of the present disclosure.

FIG. 5 is a structural hardware diagram of a charging apparatus 500 according to an embodiment of the present disclosure.

As shown in the figure, the charging apparatus 500 may be implemented by using a general-purpose computer. The charging apparatus 500 includes a memory 501, a processor 502, and a bus 503. The memory 501 and the processor 502 are connected by using the bus 503.

The processor 502 may be a general-purpose central processing unit (CPU), a microprocessor, an application-specific integrated circuit (ASIC), or one or more integrated circuits, and is configured to execute a related program, to implement the technical solutions provided in the embodiments of the present disclosure. The memory 501 may be a read-only memory (ROM), a static storage device, a dynamic storage device, or a random access memory (RAM). The memory 501 may store an operating system and another application program.

In addition, the charging apparatus 500 further includes an input device 504 and an output device 505 that are connected to the bus 503. The memory 501 stores executable code. When the processor 502 executes the executable code, the charging apparatus 500 performs the correlation charging methods shown in FIG. 2 and FIG. 3.

In addition, an embodiment of the present disclosure further provides a computer program product including an instruction. When the computer program product runs on a computer, the computer performs the correlation charging methods shown in FIG. 2 and FIG. 3.

An embodiment of the present disclosure further provides a correlation charging system. The correlation charging system mainly includes a charging apparatus, a call session control function CSCF device, and an application server AS.

The CSCF device is mainly configured to: obtain identifiers of ASs associated with a service, and then send a notification message to the charging apparatus, where the notification message carries the identifiers of the plurality of application servers ASs triggered by the service. In addition, the notification message may further carry an identifier of a current charging session that is obtained by the CSCF device.

The application server AS is mainly configured to: send a charging request message to the charging apparatus, and send a response message to the charging apparatus after receiving a detection message sent by the charging apparatus. The charging apparatus is mainly configured to: receive the notification message sent by the call session control function device, where the notification message carries the identifiers of the plurality of application servers ASs triggered by the service; determine whether the charging apparatus receives charging request messages from all the ASs within a preset period, where the charging request messages carry the identifiers of the ASs; send a detection message to a first AS from which the charging apparatus has not received any charging request message, where the detection message is used to obtain a charging capability of the first AS; and receive a response message returned by the first AS, and perform correlation charging on the service based on the received charging request messages and the charging capability that is carried in the response message.

All related content of the steps in the foregoing method embodiments can be cited in the devices in the system, and details are not described herein again. For a specific function and structure of the charging apparatus, refer to the related embodiments in FIG. 4 and FIG. 5. Optionally, the charging system may further include a device such as a gateway device or an HSS.

In the several embodiments provided in this application, it should be understood that the disclosed system, apparatus, and method may be implemented in other manners. For example, the described apparatus embodiments are merely examples. For example, the unit division is merely logical function division, and there may be another division manner during actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electrical, mechanical, or other forms.

The units described as separate parts may or may not be physically separate, and parts displayed as units may or may not be physical units, to be specific, may be located in one position, or may be distributed on a plurality of network units. Some or all of the units may be selected according to actual requirements to achieve the objectives of the solutions of the embodiments of the present disclosure.

In addition, the function units in the embodiments of the present disclosure may be integrated into one processing unit, or each of the units may exist alone physically, or two or more units may be integrated into one unit. The integrated unit may be implemented in a form of hardware, or may be implemented in a form of a software function unit.

All or some of the foregoing embodiments may be implemented by software, hardware, firmware, or any combination thereof. When software is used to implement the embodiments, all or some of the embodiments may be implemented in a form of a computer program product. The computer program product includes one or more computer instructions. When the computer program instructions are loaded and executed on a computer, all or some of the procedures or functions according to the embodiments of the present disclosure are generated. The computer may be a general-purpose computer, a special-purpose computer, a computer network, or another programmable apparatus. The computer instruction may be stored in a computer readable storage medium, or may be transmitted by using the computer readable storage medium. The computer instruction may be transmitted from one website, computer, server, or data center to another website, computer, server, or data center in a wired or wireless (for example, infrared, radio, or microwave) manner. The computer readable storage medium may be any usable medium accessible to the computer. For example, the computer instruction may be stored or transmitted by using a magnetic medium (for example, a floppy disk, a hard disk, or a magnetic tape), an optical medium, or a semiconductor medium.

The foregoing descriptions are merely specific implementations of the present disclosure, but are not intended to limit the protection scope of the present disclosure. Any equivalent modification or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A correlation charging method, wherein the method is applied to a charging apparatus, and the method comprises:
    receiving a notification message sent by a call session control function device, wherein the notification message carries identifiers of a plurality of application servers (ASs) triggered by a service;
    determining whether the charging apparatus receives charging request messages from all the ASs within a preset period, wherein the charging request messages carry the identifiers of the ASs;
    sending a detection message to a first AS from which the charging apparatus has not received any charging request message, wherein the detection message is used to obtain a charging capability of the first AS; and
    receiving a response message returned by the first AS, and performing correlation charging on the service based on the received charging request messages and the charging capability that is carried in the response message.

2. The method according to claim 1, further comprising:
    if the charging apparatus receives the charging request messages from all the ASs within the preset period, performing correlation charging on the service based on all the received charging request messages.

3. The method according to claim 1, wherein the performing of correlation charging on the service based on the received charging request messages and the charging capability that is carried in the response message comprises:
    when the charging capability carried in the response message is offline charging, performing offline correlation charging on the service based on the received charging request messages.

4. The method according to claim 2, wherein the performing of correlation charging on the service based on all the received charging request messages comprises:
    if the charging request messages sent by all the ASs comprise at least one offline charging request message, performing offline correlation charging on the service based on charging request messages sent by all the ASs.

5. The method according to claim 4, further comprising:
    if all the charging request messages sent by all the ASs are online charging requests, performing online correlation charging on the service based on the charging request messages sent by all the ASs.

6. The method according to claim 1, wherein the notification message and the charging request message each carry an identifier of a charging session corresponding to the service.

7. A charging apparatus for correlation charging, comprising:
    at least one processor;
    a non-transitory computer-readable storage medium coupled to the at least one processor and storing programming instructions for execution by the at least one processor, wherein the programming instructions instruct the at least one processor to:
    receive a notification message sent by a call session control function device, wherein the notification message carries identifiers of a plurality of application servers (Ass) triggered by a service;
    determine whether the charging apparatus receives charging request messages from all the ASs within a preset period, wherein the charging request messages carry the identifiers of the ASs; and
    send a detection message to a first AS from which the charging apparatus has not received any charging request message, wherein the detection message is used to obtain a charging capability of the first AS, wherein the programming instructions further instruct the at least one processor to receive a response message returned by the first AS, and perform correlation charging on the service based on the received charging request messages and the charging capability that is carried in the response message.

8. The charging apparatus according to claim 7, wherein the programming instructions further instruct the at least one processor to: when the charging apparatus receives the charging request messages from all the ASs within the preset period, charge the service based on all the received charging request messages.

9. The charging apparatus according to claim 7, wherein the programming instructions instruct the at least one processor to: when the charging capability carried in the response message is offline charging, perform offline correlation charging on the service based on the received charging request message.

10. The charging apparatus according to claim 7, wherein the notification message and the charging request message each carry an identifier of a charging session.

11. A correlation charging system comprising a charging apparatus and a plurality of application servers (ASs), wherein the charging apparatus comprises:
    at least one processor; and
    a non-transitory computer-readable storage medium coupled to the at least one processor and storing programming instructions for execution by the at least one processor, wherein the programming instructions instruct the at least one processor to:

receive a notification message sent by a call session control function device, wherein the notification message carries identifiers of the ASs, triggered by a service;

determine whether the charging apparatus receives charging request messages from all the ASs within a preset period, wherein the charging request messages carry the identifiers of the ASs;

send a detection message to a first AS from which the charging apparatus has not received any charging request message, wherein the detection message is used to obtain a charging capability of the first AS; and receive a response message returned by the first AS, and perform correlation charging on the service based on a received charging request message and the charging capability that is carried in the response message.

12. The system according to claim 11, wherein the programming instructions further instruct the at least one processor to:

perform, if the charging apparatus receives the charging request messages from all the ASs within the preset period, correlation charging on the service based on all the received charging request messages.

13. The system according to claim 11, wherein the programming instructions further instruct the at least one processor to:

perform, when the charging capability carried in the response message is offline charging, offline correlation charging on the service based on the received charging request message.

14. The system according to claim 12, wherein the programming instructions further instruct the at least one processor to:

perform, if the charging request messages sent by all the ASs comprise at least one offline charging request, offline correlation charging on the service based on charging request messages sent by all the ASs.

15. The system according to claim 14, wherein the programming instructions further instruct the at least one processor to:

perform, if all the charging request messages sent by all the ASs are online charging requests, online correlation charging on the service based on the charging request messages sent by all the ASs.

16. The system according to claim 11, wherein the notification message and the charging request message each carry an identifier of a charging session corresponding to the service.

* * * * *

UNITED STATES PATENT AND TRADEMARK OFFICE
CERTIFICATE OF CORRECTION

PATENT NO. : 10,739,406 B2
APPLICATION NO. : 16/599762
DATED : August 11, 2020
INVENTOR(S) : Enfeng Yang Page 1 of 1

It is certified that error appears in the above-identified patent and that said Letters Patent is hereby corrected as shown below:

On the Title Page

Item (30), the foreign application priority data shown below should be:
-- Foreign Application Priority Data
Jun. 8, 2017 (CN) ......... 201710428340.8 --

Signed and Sealed this
Sixth Day of October, 2020

Andrei Iancu
*Director of the United States Patent and Trademark Office*